(12) United States Patent
Messier

(10) Patent No.: US 7,336,748 B2
(45) Date of Patent: Feb. 26, 2008

(54) DDS CIRCUIT WITH ARBITRARY FREQUENCY CONTROL CLOCK

(75) Inventor: Jason Messier, Boston, MA (US)

(73) Assignee: Teradyne, Inc., North Reading, MA (US)

( * ) Notice: Subject to any disclaimer, the term of this patent is extended or adjusted under 35 U.S.C. 154(b) by 711 days.

(21) Appl. No.: 10/744,039

(22) Filed: Dec. 23, 2003

(65) Prior Publication Data
US 2005/0135525 A1    Jun. 23, 2005

(51) Int. Cl.
*H04L 7/00* (2006.01)
(52) U.S. Cl. .................. 375/354; 375/362
(58) Field of Classification Search ........... 375/224, 375/354, 362
See application file for complete search history.

(56) References Cited

U.S. PATENT DOCUMENTS

| | | | | |
|---|---|---|---|---|
| 5,021,872 A * | 6/1991 | Shiratsuchi | ............... | 348/505 |
| 5,339,338 A * | 8/1994 | Elliott | ............... | 375/372 |
| 5,382,913 A * | 1/1995 | Carson et al. | ............... | 327/141 |
| 5,656,976 A * | 8/1997 | Jung et al. | ............... | 331/18 |
| 5,710,517 A * | 1/1998 | Meyer | ............... | 327/163 |
| 5,757,239 A * | 5/1998 | Gilmore | ............... | 331/18 |
| 5,963,607 A * | 10/1999 | Romano et al. | ............... | 375/373 |
| 6,066,967 A * | 5/2000 | Cahill et al. | ............... | 327/107 |
| 6,625,435 B1* | 9/2003 | Ramesh | ............... | 455/313 |
| 6,642,754 B1* | 11/2003 | Dobramysl et al. | ............... | 327/105 |
| 6,888,888 B1* | 5/2005 | Tu et al. | ............... | 375/240.01 |
| 2001/0005408 A1* | 6/2001 | Neukom | ............... | 375/376 |
| 2004/0179628 A1* | 9/2004 | Haskin | ............... | 375/271 |
| 2004/0217790 A1* | 11/2004 | Saeki | ............... | 327/158 |

OTHER PUBLICATIONS

International Search Report, Mailing Date Apr. 11, 2005.

* cited by examiner

Primary Examiner—David C. Payne
Assistant Examiner—Leon-Viet Q Nguyen
(74) Attorney, Agent, or Firm—Wolf, Greenfield & Sacks, P.C.

(57) ABSTRACT

A test system using direct digital synthesis for generation of a spectrally pure, agile clock. The clock is used in analog and digital instruments in automatic test system. A DDS circuit is synchronized to the tester system clock because it is clocked by a DDS clock generated from the system clock. Accumulated phase error is reduced through the use of a parallel accumulator that tracks accumulated phase relative to the system clock. At coincidence points, the accumulated phase in the DDS accumulator is reset to the value in the system accumulator.

14 Claims, 4 Drawing Sheets

DDS CIRCUIT WITH ARBITRARY FREQUENCY CONTROL CLOCK

This invention relates generally to signal generation and more specifically to generation of periodic signals in a flexible manner.

BACKGROUND OF THE INVENTION

Direct Digital Synthesis ("DDS") is a technique used to generate periodic signals where control over one or more signal properties is desired. Analog signals can be generated with either the period or the wave shape controlled through DDS.

FIG. 1 shows a traditional DDS architecture with DDS 100 being used to generate a sine wave that is then converted to a two-valued clock. DDS 100 receives an accumulator clock $CLK_{ACC}$ and a digital input signal $\Phi_{Inc}$ indicating a phase increment. The DDS outputs a signal $F_{OUT}$. The frequency of $F_{OUT}$ can be set by varying the frequency of $CLK_{ACC}$ and/or varying the phase increment $\Phi_{Inc}$.

In operation, accumulator 110 produces a new output value $\Phi_{Acc}$ on each cycle of $CLK_{ACC}$. To produce each new value, the accumulator 110 adds $\Phi_{Inc}$ to its current contents. As shown in FIG. 1, accumulator 110 can be constructed from an adder 110a and a register 110b.

The value in accumulator 110 serves as a control input to Sine Unit 112. Sine Unit 112 converts each phase value $\Phi_{Acc}$ into a corresponding amplitude value. In the illustration, the DDS signal generator is producing a sine wave, accordingly, the amplitude values are related to the value $\Phi_{Acc}$ by the function $\sin(\Phi_{Acc})$. Sine Unit 112 might generate the required outputs using a math engine—a circuit configured to producing an output signal having a specific mathematical relationship to an input signal. Alternatively, it is possible to implement a sine unit by pre-computing the required output value for each value of the control input. These pre-computed output values are then stored in a memory at locations addressed by the control input. In operation, the control inputs are applied as addresses to the memory, resulting in the required output value of $\sin(\Phi_{Acc})$ being read from the memory for each of $\Phi_{Acc}$ applied as an input.

The output of sine unit 112 is periodic. Periodicity is achieved because of overflow in accumulator 110. The value stored in accumulator 110 increases (or decrease if negative values of $\Phi_{Inc}$ are used) for every cycle of $CLK_{ACC}$. Eventually, the value in accumulator 110 overflows (or underflows—if negative values of $\Phi_{Inc}$ are used). The full scale value of the accumulator is selected to correspond to a phase of 2 pi radians. If the addition of $\Phi_{Inc}$ would cause the value of $\Phi_{Acc}$ to exceed 2 pi radians by an amount x, after the overflow, the accumulator stores only the value x. As a result, an overflow of the accumulator has the same effect as starting a new cycle of the periodic waveform, with the appropriate phase relationship maintained between the end of one cycle and the beginning of the next cycle.

The duration of one cycle of the waveform $F_{out}$ can be controlled by altering the time it takes for accumulator 110 to overflow. This time can be controlled by changing the frequency of clock $CLK_{ACC}$. This time can also be controlled by changing the value of $\Phi_{Inc}$.

Digital values representing $\sin(\Phi_{Acc})$ are then fed to a DAC 114, which converts them to a quantized analog signal. Usually, a filter is attached to the output of the digital to analog converter to smooth out the quantized signal. Where a sine wave is required, the filter is likely a bandpass filter because a bandpass filter that includes the desired frequency of the sine wave in its pass band will increase the "spectral purity" of the signal. If a digital signal, such as a clock, is desired, the analog signal may be fed to a comparator 118 to square off the signal. Thus, the DDS signal generator provides a convenient mechanism to generate a clock of controlled frequency.

Because the frequency of waveform $F_{out}$ is influenced by the frequency of $CLK_{ACC}$, it is not possible to arbitrarily set the frequency of $CLK_{ACC}$. There are some applications in which the use of DDS is desired, but the DDS must be compatible with circuits clocked at other frequencies. An example of such an application is automatic test equipment. FIG. 7 shows in greatly simplified form a block diagram of an automatic test system 800 of the type that might be used to test semiconductor chips. An example of such a system is the Tiger™ test system sold by Teradyne, Inc. of Boston, Mass., USA.

The test system includes a work station 810 that controls the test system 800. Work station 810 runs test programs that set up the hardware within tester body 812 and reads back results of tests. The work station also provides an interface to a human operator so that the operator can provide commands or data for testing a particular type of semiconductor device. For example a program running on work station 810 might change the value of a register inside tester body 812 holding the value of $\Phi_{Inc}$ to change the frequency of a clock within the test system.

To fully test many types of devices, both analog and digital test signals must be generated and measured. Inside tester body 812 are digital "pins" 820 and analog instruments 818. Both are connected to the device under test 850. Digital pins are circuits that generate or measure digital signals or DC voltages and currents. In contrast, analog instruments generate and measure analog signals.

Pattern generator 816 provides control inputs to the digital pins 820 and the analog instruments 818. These control inputs define both the values and the time at which test signals should be generated or measured. To ensure an accurate test, the actions of the digital pins and the analog instruments often must be synchronized. Timing generator 814 provides timing signals that synchronize operation of the various components within tester body 812.

Automatic test equipment is made programmable so that it can test many different types of devices. It is often desirable to be able within automatic test equipment to generate a digital clock of a programmable frequency. An example of such an application is called an arbitrary waveform generator (AWG). AWG 822 creates a waveform that can be programmed into an almost arbitrary shape using a clock of controllable frequency. In the prior art, a DDS signal generator 100 has been used as the clock for the AWG.

Automatic test equipment also sometimes contains an analog instrument called a digitizer. Digitizer 823 also relies on a clock, which should preferably be programmable.

A difficulty arises because the DDS circuit is clocked by clock $CLK_{ACC}$. Pattern generator 816 or timing generator 814 might output commands or control signals at a different frequency. It would be highly desirable to have the DDS easily interface to other parts of the system, even if clocked by clocks of different frequencies.

In an automatic test system, it is often important to control the time relationship between signals in analog instruments and digital pins. For this reason, there is a desire to have all instruments in a tester synchronized to some timing reference. Even if a DDS circuit is operating at a different clock frequency than other portions of a system, it would also be desirable to synchronize the clock used in the DDS to a clock used to control overall system timing.

SUMMARY OF THE INVENTION

It is an object to provide a DDS circuit synchronized to an external clock.

The foregoing and other objects are achieved in a DDS circuit having an accumulator operating at a first frequency and an accumulator operating at a second frequency. Based on the relationship between the frequencies, nominal points of coincidence between the clocks will occur. At these points of coincidence, one accumulator is loaded with the value of the other.

In a preferred embodiment, the DDS circuit is used in automatic test equipment having central control circuit clocked at a first frequency and DDS circuitry operating at a DDS clock frequency different than the first frequency.

DETAILED DESCRIPTION

Figure 1:
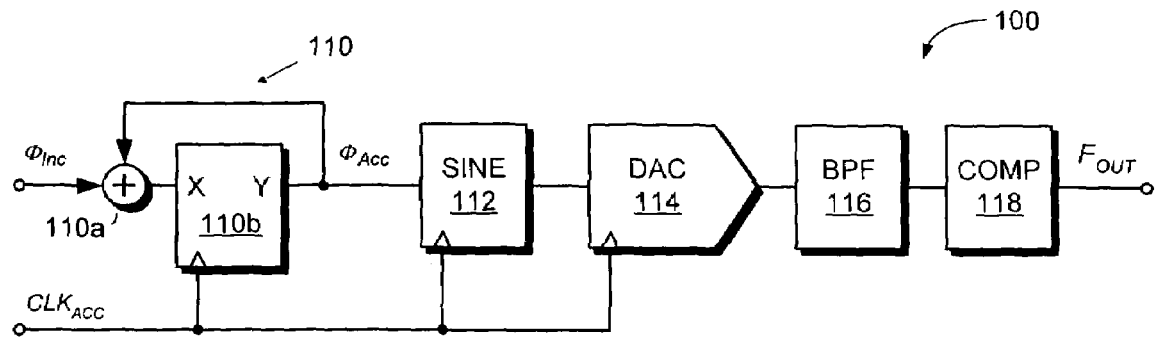
FIG. 1 illustrates a prior art DDS circuit.
Figure 2:
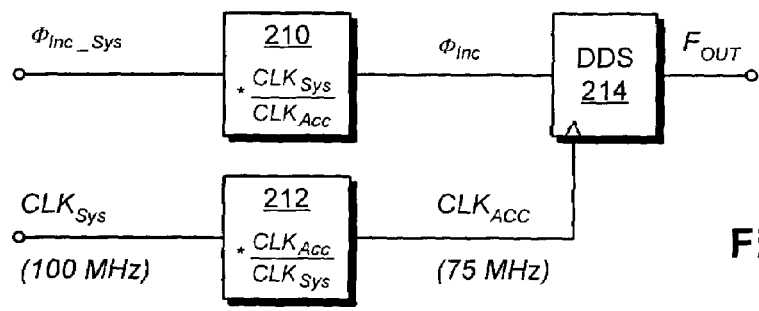
FIG. 2 illustrates a DDS circuit operating in a system clocked at a different frequency than the DDS circuit.

FIG. 2 shows simplified block diagram of a digital synthesis circuit operating in a system that uses a different frequency than the DDS circuit. DDS 214 generates $F_{OUT}$. DDS 214 may be a DDS circuit such as is shown in the prior art. Alternatively, DDS 214 may be a circuit as shown in my copending patent application entitled HIGH RESOLUTION SYNTHESIZER WITH IMPROVED SIGNAL PURITY, filed on the same date as this application, which is hereby incorporated by reference. Regardless of the precise construction of DDS 214, the frequency at which DDS 214 is clocked influences the frequency of $F_{OUT}$.

DDS 214 is clocked by clock $CLK_{ACC}$. The frequency of $CLK_{ACC}$ is, for purposes of illustration, 75 MHz. The actual frequency will depend on the desired characteristics of $F_{OUT}$. Also, as will be described below, $CLK_{ACC}$ is generated by frequency multiplier 212. Because frequency multiplier 212 has finite precision, $CLK_{ACC}$ might not have exactly the desired frequency. Accordingly, $CLK_{ACC}$ "nominally" has a frequency of 75 MHz in the example.

Frequency multiplier 212 receives an input from a system clock $CLK_{Sys}$. In a preferred embodiment where DDS 214 is used in an analog instrument of an automatic test system, such as AWG 822 of test system 800, $CLK_{Sys}$ is a clock generated by timing generator 814. $CLK_{Sys}$ is used to clock other portions of the test system, such as pattern generator 816 and digital pins 820.

Because it is often important for an analog instrument, such as AWG 822, to be synchronized to the other parts of the test system, $CLK_{ACC}$ is preferably derived from $CLK_{Sys}$, as shown in FIG. 2.

Also, test system 800 is programmed relative to $CLK_{Sys}$. Therefore, it is advantageous to specify the phase increment of DDS 214 required for each cycle of $CLK_{Sys}$. In FIG. 2, a phase increment for each cycle of $CLK_{Sys}$ is denoted $\Phi_{Inc\_Sys}$. In operation, though, accumulator 110 must receive a value of $\Phi_{Inc}$ that is appropriate for use with an accumulator clocked by $CLK_{ACC}$. Multiplier 210 converts $\Phi_{Inc\_Sys}$ to $\Phi_{Inc}$.

Both frequency multiplier 212 and multiplier 210 determine their scale factors based on the ratio between $CLK_{Sys}$ and $CLK_{ACC}$. Multiplier 210 may be a digital circuit as is known in the art. For example, multiplier 210 could use a digital multiplier and a digital divider circuit in series to compute an output representing the input multiplied by the required fraction. It is relatively easy to construct circuits that multiply or divide by integers. Accordingly, scale factors, even those that are not integers, can be easily applied by expressing the scale factor as a ratio of integers. It is easier to construct a circuit to divide and then multiply by integers to arrive at the required scale factor than to create one circuit that scales by a non-integer amount. The principle is particularly useful for scaling the frequency of a clock, but also applies to scaling a number, such as to convert $\Phi Inc_{\_Sys}$ to $\Phi_{Inc}$. Such circuits are known in the art.

Frequency multiplier 212 may be a frequency multiplier as is known in the art. It may use a frequency divider followed by a frequency multiplier to produce an output signal having an output frequency with the required frequency ratio to the input signal.

The circuit of FIG. 2 produces signals for $\Phi_{Inc}$ and $CLK_{ACC}$ with nominal values that produce an output $F_{OUT}$ with the required characteristics. For example, if $\Phi_{Inc\_Sys}$ has a value of 5, the output of multiplier 210 equals 5*(100 MHz/75 MHz).

Figure 3:
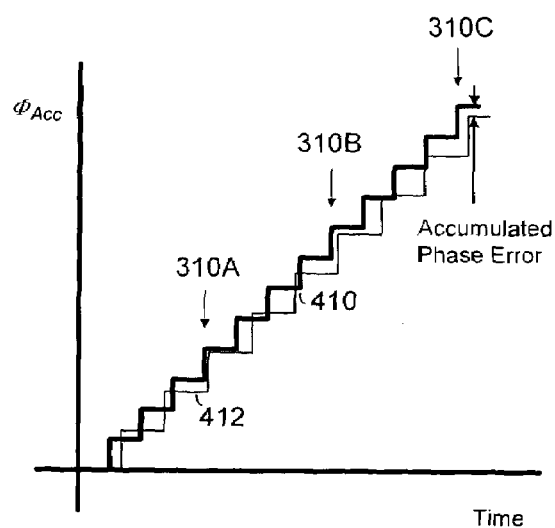
FIG. 3 is a graph useful in understanding accumulated phase error.

FIG. 3 shows the results in a practical implementation of the system of FIG. 2. Curve 410 shows the accumulated phase value that would result from clocking an accumulator fed by $\Phi_{Inc\_Sys}$ and clocked with a clock $CLK_{Sys}$. As can be seen, the value in the accumulator increases a uniform amount for each cycle of $CLK_{Sys}$.

Curve 412 shows a curve of the accumulated phase value in an accumulator fed by $\Phi_{Inc}$ and clocked with a clock $CLK_{ACC}$. In the example, the ratio between $CLK_{Sys}$ and $CLK_{ACC}$ is 100 to 75 (i.e. 4 to 3). For every 4 cycles of $CLK_{Sys}$, there should be 3 cycles of $CLK_{ACC}$. Coincidence points 310A, 310B and 310C indicate every 4 cycles of $CLK_{Sys}$. At these points, $CLK_{Sys}$ and $CLK_{ACC}$ nominally switch at the same time. The clocks can be said to be nominally coincident at these points. Also at these points, the accumulated phase value in both accumulators should be equal. However, FIG. 3 shows that the two values are not truly coincident and are not identical at the coincidence points. These differences result from the fact that the value of $\Phi_{Inc}$ differs from its nominal value. Also, there might be delay or other distortion that precludes $CLK_{ACC}$ from being timed precisely as desired.

In the example, after 4 cycles of $CLK_{Sys}$, there are nominally 3 cycles of $CLK_{ACC}$. At this time, the accumulated phase value should be 3*(5*(4/3))=20. The nominal result is the same as if $\Phi_{Inc\_Sys}$ were added to an accumulator in each the 4 cycles of $CLK_{Sys}$. However, it is not possible to produce in a practical system a multiplier 210 that outputs exactly the right value. In this example, the value of $\Phi_{Inc}$ is computed as 5*(4/3), which equals 6.66666 . . . No digital circuit could be constructed to represent this value. The registers that hold the value of $\Phi_{Inc}$ and the circuitry used for computations will have finite numbers of bits. For example, rather than storing a value of 5*(4/3), $\Phi_{Inc}$ might actually have a value of 6.6.

For some applications, the difference between 6.6 and 5*(4/3) will be too small to have a practical impact on the operation of the DDS circuitry. In the example of FIG. 3, the accumulated phase is 19.8 rather than 20 at coincidence point 310A. However, in other applications, this difference might be significant and further improvements might be made to the DDS circuitry.

For example, FIG. 3 shows that the difference between curves 410 and 412 grows at each successive coincidence point. This difference is denoted as the accumulated phase error. As DDS runs for longer periods of time, the accumulated phase error grows.

Figure 4:
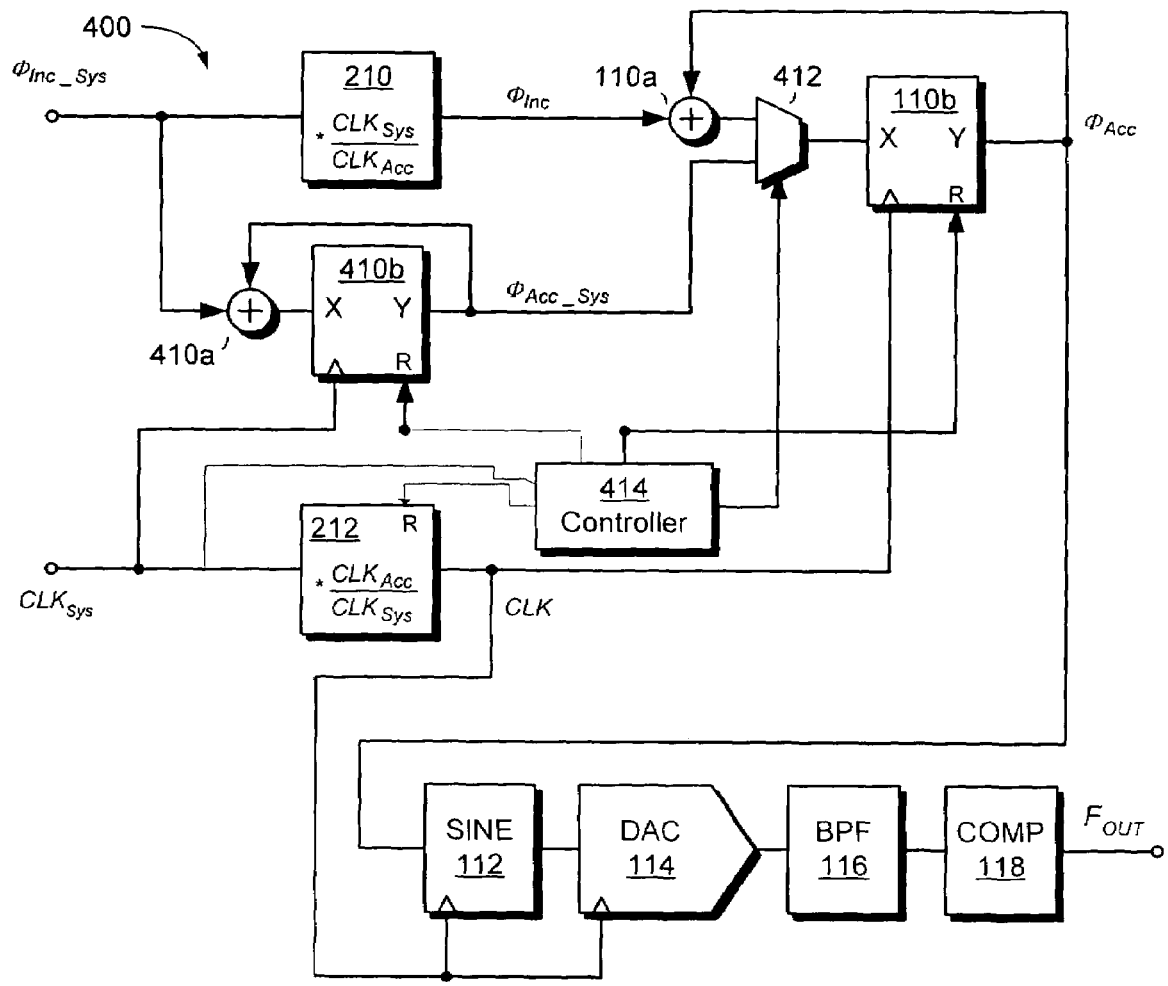
FIG. 4 is an improved DDS circuit operating in a system clocked at a different frequency than the DDS Circuit.

FIG. 4 shows a DDS circuit 400 that is modified to limit the growth in the phase error. DDS circuit 400 includes an accumulator made of register 110b and a summer 110a. One input to summer 110a is the value in register 110b. The other input is $\Phi_{Inc}$, derived from $\Phi_{Inc\_Sys}$ in multiplier 210, as discussed above in connection with FIG. 2. The output of register 110B serves as the phase control input to sine unit 112. Sine unit 112 is coupled to DAC 114, bandpass filter 116 and comparator 118 to generate a signal $F_{OUT}$ as described above.

Accumulator register 110b is clocked by a signal CLK, which is derived from $CLK_{Sys}$ by frequency multiplier 212.

DDS circuit 400 includes a second accumulator, with accumulator register 410b and adder 410a. One of the inputs to adders 410a is $\Phi_{Inc\_Sys}$. The other input is the contents of accumulator register 410b.

Curve 410 (FIG. 3) represents the contents of accumulator register 410b. Without correction, curve 412 would represent the contents of accumulator register 110b. However, DDS circuit 400 includes controller 414 that periodically resynchronizes the contents of accumulator register 110b with accumulator register 410b.

Controller 414 periodically resynchronizes the value in accumulator register 110b with the value in accumulator register 410b. Controller 414 causes the resynchronization when CLK is nominally coincident with $CLK_{Sys}$. As shown in FIG. 3, CLK is nominally coincident with $CLK_{Sys}$ every 4 cycles of $CLK_{Sys}$.

More generally, the nominal points of coincidence can be determined by dividing the frequency of each clock by the greatest common factor of the two frequencies. In the present example, the greatest common factor of 100 and 75 is 25. Therefore, points of nominal coincidence occur every 4 cycles of the 100 MHz clock and every 3 cycles of the 75 MHz clock.

It is not necessary that the resynchronization occur for every point of nominal coincidence. The frequency with which the accumulators should be resynchronized depends on the amount of error introduced with each cycle and the tolerance of the overall application to such errors.

Controller 414 stores the required number of pulses of $CLK_{Sys}$ that must pass between points of nominal coincidence. This number could be computed by circuitry within controller 414 based on a value controlling the desired frequency of CLK. Alternatively, this number could be computed, such as in work station 810, and loaded into controller 414. The value is preferably stored in a programmable digital storage location, such as a register or a counter. In operation, controller 414 outputs a control signal when accumulator register 110b should be resynchronized with accumulator register 410b.

To resynchronize, controller 414 asserts the control line to selector 412. Selector 412 has two switchable inputs. One of the switchable inputs is connected to the output of adder 1110a. Between synchronizations, selector 412 switches the output of adder 110a to the input of accumulator register 110a.

The other switchable input of selector 412 is connected to the output of accumulator register 410b. Upon a resynchronization, selector 412 switches contents of accumulator register 410b to the input of accumulator register 110b. In this way, accumulator register 110b is periodically resynchronized and the accumulated phase error does not continue to grow as shown in FIG. 3.

As was described above, at a point of nominal coincidence, CLK and $CLK_{Sys}$ should occur simultaneously. However, it is possible that the CLK and $CLK_{Sys}$ will also be out of phase because of inaccuracies in the generation of the signal CLK. To avoid any timing errors associated with this inaccuracy, register 110b contains a reset input that is generated by controller 414. Controller 414 asserts this reset input at the appropriate time to load the value from accumulator register 410b into accumulator register 110b.

Before issuing the reset command to accumulator register 110b, selector 412 must be switched and its output stable. Additionally, it must be ascertained that both $CLK_{Sys}$ and CLK have reached their nominal coincidence points. If the value is loaded into accumulator register 110b before $CLK_{Sys}$ reaches its coincidence point, the value loaded into register 110b will be an incorrect value, reflecting the value in accumulator 410b before the coincidence point. Conversely, if the value is loaded into register 110b before CLK reaches its coincidence point, the value loaded into accumulator register will initially be the correct value, but when CLK reaches the coincidence point, that value will be incremented and therefore changed to an incorrect value.

Controllers, such as controller 414, that generate control signals at times that are conditional upon the occurrence of other signals are well known in the art. Traditional design techniques could be used to ensure that updating of register 110b occurs at the desired time. An alternative implementation is to use a FIFO to ensure that values from accumulator 410b are loaded into accumulator 110b correctly. For example, controller 414 could include a circuit to count pulses of $CLK_{Sys}$. When $CLK_{Sys}$ reaches the coincidence point, the value of accumulator 410b is pushed into the FIFO. Controller 414 would also count pulses of CLK. When CLK reached its coincidence point, a value would be popped from the FIFO and loaded into accumulator 110b. In this way, the appropriate value would be loaded into accumulator register 110b at the appropriate time.

The size of the FIFO need not be large. A FIFO with two storage locations would likely be adequate.

Figure 5:
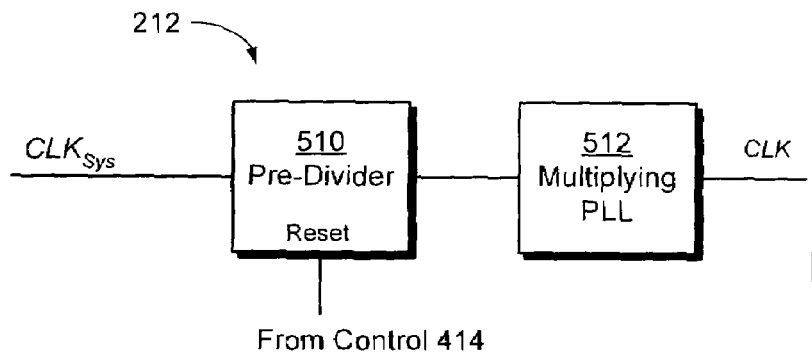
FIG. 5 is a block diagram of frequency multiplier that can be used in the circuit of FIG. 4.

It is also desirable to synchronize CLK with $CLK_{Sys}$. FIG. 5 shows that frequency multiplier 212 is preferably implemented by a frequency divider 510 followed by a frequency multiplier 512. Divider 510 has a reset input that is used for synchronization. When the reset line is asserted and deasserted, the next input pulse will cause an output pulse. Thereafter, output pulses will be produced at the divided rate. For example, if divider 510 is programmed to divide by 4, every four clock pulses at the input will result in a pulse at the output of divider 510.

In the illustrated embodiment, the output of divider 510 is fed to frequency multiplier 512. Here, frequency multiplier is shown implemented as a multiplying phase-locked loop (PLL). For each pulse input to the multiplying PLL 512, multiple pulses are generated. However, the first output pulse will be generated in response to the pulse that is output from divider 510. Because the output of divider 510 is synchronized to the system clock after a reset, the first pulse out of multiplying PLL 512 is also synchronized to the system clock following a reset.

Synchronization of frequency multiplier should, preferably, be done when DDS circuit 400 is initialized to generate a new signal. It might optionally be done at a point of nominal coincidence to ensure that any errors that occur not allow the clocks to be out of synchronization.

Figure 6:
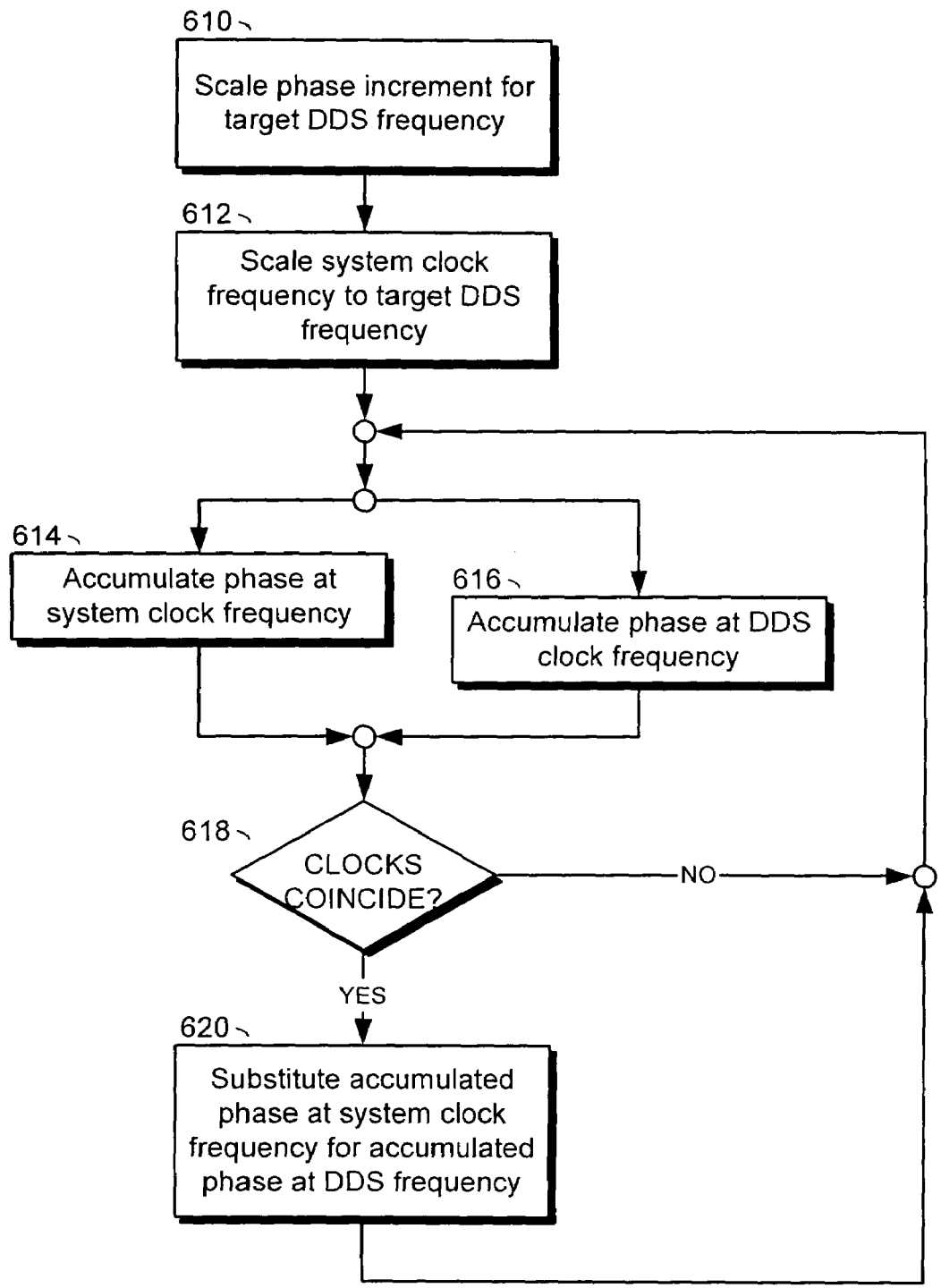
FIG. 6 is a flow chart useful in understanding the operation of the circuit FIG. 4.
Figure 7:
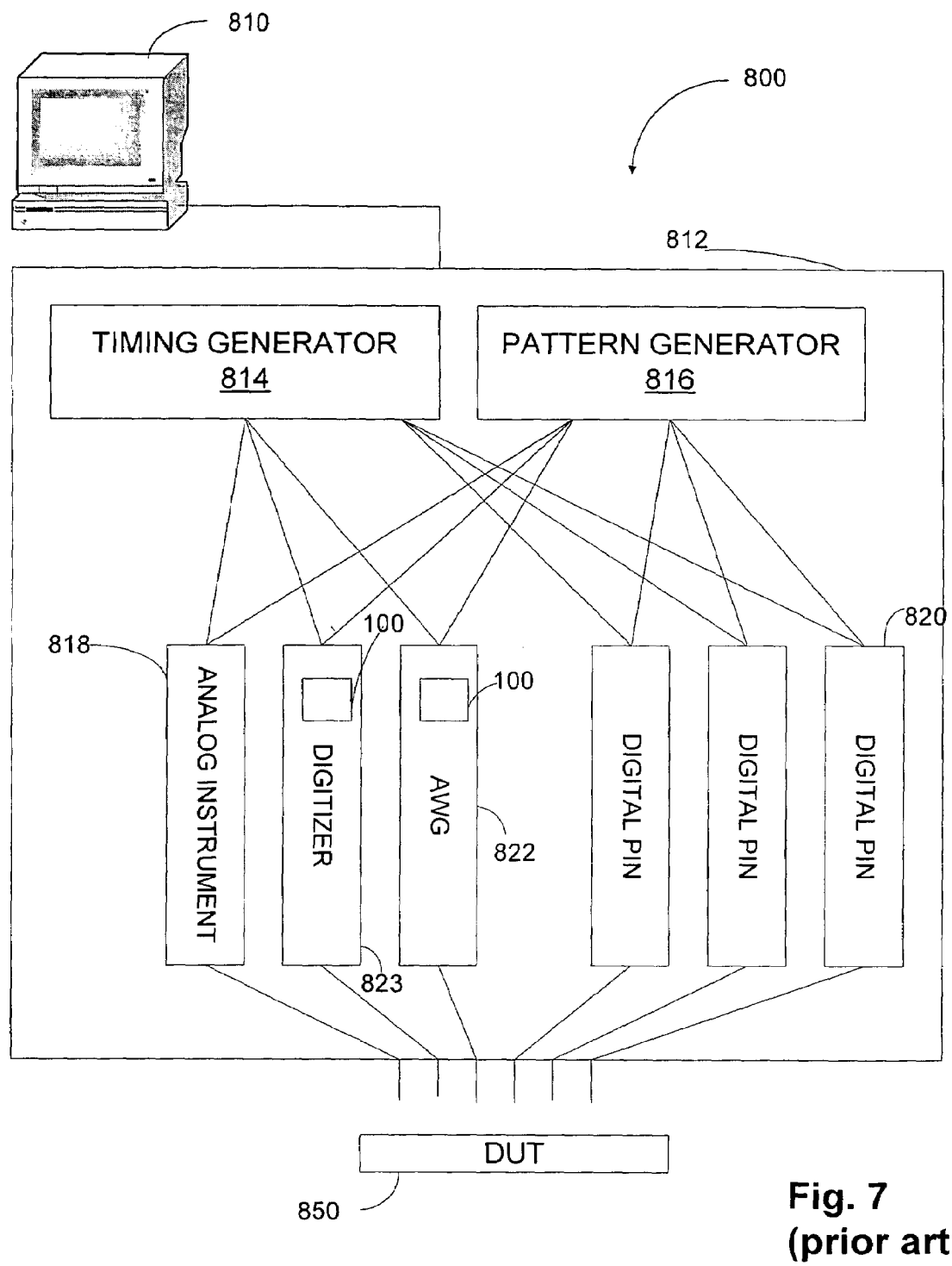
FIG. 7 is a simplified block diagram of a prior art automatic test system.

FIG. 6 shows a flow chart of the method of operating a DDS circuit. At step 610, the phase increment is scaled to provide an appropriate phase increment for the DDS circuit. The scale factor is a fraction having as its numerator the frequency of operation of the DDS and as its denominator the frequency of operation of the system providing inputs.

At step 612, a clock having the desired frequency of the DDS is generated. Preferably, this clock is generated by scaling the frequency of the system clock.

At steps 614 and 616, phase values are accumulated. Step 614 indicates that phase values are accumulated at the system clock frequency. This accumulation is done use the phase increment specified in relation to the system frequency. At step 616, the phase increment accumulated computed at step 610 is accumulated at the frequency of the DDS clock determined at step 612.

At step 618, a check is made as to whether the DDS clock and the system clock should nominally be coincident. As described above, this decision can be made by counting pulses of the system clock or the generated DDS clock. As an alternative, where the differences between the DDS clock and its nominal value are small, it could be possible to detect nominal points of coincidence observing when the two clocks coincided to within a small band or error. At this point, it might be assumed that the clocks should be coincident. As a further alternative, it might be possible to detect coincidence by monitoring the accumulated phases determined at steps 414 and 416. When the accumulated phases are equal, to within a small error, it might be determined that the clocks should be coincident at that point and synchronize the accumulated values.

Regardless of how points of nominal coincidence are detected, if for some cycle no coincidence is detected, processing returns to steps 414 and 416, where further phase increments are accumulated. However, if the accumulated phases are nominally coincident, processing proceeds to step 620.

At step 620, the phase accumulated at the system clock frequency is substituted for the phase accumulated at the DDS frequency. As part of this step, the DDS clock might also be resynchronized to the system clock.

As described above, a spectrally pure signal can be generated in a way that allows the frequency of the signal to be changed (i.e. the signal is agile). Such a clock can be used to clock analog or digital instruments in an automatic test system or in other applications where a pure, agile clock is required.

The above described system can be used to increase the accuracy of a DDS and to ensure the DDS stays synchronized with a system clock. It also provides an easy way to change the programming of the DDS based on commands from the system. For example, pattern generator 816 might provide a command to change the frequency of the signal generated by the DDS. Such a command might come in the form of a new value of $\Phi_{Inc\_Sys}$. The change to the new programmed setting can be made by changing the phase increment command. At the next resynchronization interval, any error will be automatically corrected. Various alternatives are possible.

For example, it is described above that a FIFO is used buffer the output of accumulator register 410b until the appropriate time for that value to be stored in accumulator register 110b. With appropriate control, a register might be connected to buffer these values, acting as a single word FIFO.

It is described that points of nominal coincidence are detected by counting pulses of $CLK_{Sys}$. Because CLK is derived from $CLK_{Sys}$, the result could be achieved by counting pulses of CLK.

Further, mathematical relationships between various quantities are described. It should be appreciated that the circuits and methods described above will work, even if there is imprecision in the computation of these numbers or their values are approximated.

Also, certain functionality is shown implemented in hardware. But, portions of the functionality could be implemented in software as part of the setup of the circuitry.

What is claimed is:

1. A method of synchronizing a DDS circuit clocked at a DDS frequency to a first clock, with a first phase increment of the DDS being specified for a period of the first clock, comprising:
    a) generating a clock at the DDS frequency from the first clock, the DDS frequency being a non-integer multiple of the frequency of the first clock;
    b) producing a DDS phase increment by scaling the first phase increment in proportion to the ratio between the DDS frequency and the frequency of the first clock;
    c) accumulating the DDS phase increment in a DDS accumulator within the DDS circuit that is clocked by the clock at the DDS frequency;
    d) accumulating the first phase increment in a second accumulator, the second accumulator clocked by the first clock; and
    e) periodically replacing the value in the DDS accumulator with the value in the second accumulator at an interval determined by the ratio between the DDS frequency and the frequency of the first clock, wherein the interval is an integer multiple of the product of the period of the first clock and the frequency of the first clock divided by the greatest common multiple of the first clock frequency and the DDS frequency.

2. The method of claim 1 wherein periodically replacing the value in the DDS accumulator comprises replacing the value when the DDS clock and the first clock are nominally coincident.

3. The method of claim 1 wherein generating a clock at the DDS frequency comprises generating a clock within a frequency scaling circuit and the frequency scaling circuit is reset when the value in the DDS accumulator is replaced.

4. The method of claim 1 additionally comprising changing the first phase increment at a time synchronized to the first clock.

5. Apparatus for generating a periodic signal comprising:
    a) a first clock having a first frequency;
    b) a control input;
    c) a frequency conversion circuit having an input and an output, wherein the input is coupled to the first clock and the output is a second clock at a second frequency;
    d) an arithmetic circuit having an input and an output, both the input and the output being represented as digital values with the output having a value proportional to the input, with the proportionality defined by the ratio of the first frequency and the second frequency;

e) a direct digital synthesis circuit having a control input and a clock input, with the control input connected to the output of the arithmetic circuit and the clock input connected to the second clock, the direct digital synthesis circuit comprising an accumulator register having a control input; and f) a control circuit having an output coupled to the control input of the accumulator register, the control circuit being adapted and configured to assert the output at periodic intervals proportional to the first clock frequency divided by the greatest common multiple of the first clock frequency and the second clock frequency.

6. The apparatus of claim 5 wherein the accumulator register has an input and an output and the apparatus additionally comprises an adder and a selector, the adder having at least two inputs and an output and the selector having at least two switchable inputs, a control input and an output, the output of the accumulator register being coupled to one of the inputs of the adder and the output of the adder being coupled to one of the switchable inputs of the selector and the output of the selector being coupled to the input of the accumulator register.

7. The apparatus of claim 5 incorporated in an automatic test system having a pattern generator and the pattern generator is clocked by a clock synchronized with the first clock.

8. An automatic test system comprising:
a) system control unit containing a first clock and a first phase control value specified relative to the first clock;
b) at least one analog instrument generating a digital clock with a direct digital synthesis circuit, the direct digital synthesis circuit comprising:
i) a frequency conversion circuit having an input and an output, the input coupled to the first clock and the output providing a second clock, the frequency conversion circuit being adapted and configured to produce the second clock synchronized to the first clock and with a non-integer ratio between a frequency of the first clock and a frequency of the second clock; and
ii) an accumulator, increasing by a second phase control value for each period of the second clock, wherein the second phase control value is derived from the first phase control value with the non-integer ratio between the first phase control value and the second phase control value.

9. The automatic test system of claim 8 wherein the analog instrument comprises an arbitrary waveform generator.

10. The automatic test system of claim 8 wherein the analog instrument comprises a digitizer.

11. The automatic test system of claim 8 wherein the direct digital synthesis circuit additionally comprises a second accumulator, the second accumulator having a value increasing by the first phase control value for each period of the first clock.

12. The automatic test system of claim 11 additionally comprising a control circuit to switch the value of the second accumulator into the accumulator at periodic intervals.

13. The automatic test system of claim 12, wherein the control circuit is additionally adapted and configured to determine the periodic intervals at coincidence points between the first clock and the second clock.

14. The automatic test system of claim 8, further comprising at least one digital instrument, the at least one digital instrument coupled to the system control unit and adapted and configured to operate in response to the first clock.

* * * * *